US006888241B1

(12) United States Patent
Korn et al.

(10) Patent No.: US 6,888,241 B1
(45) Date of Patent: May 3, 2005

(54) ELECTRONIC MULTIPURPOSE SEAL WITH PASSIVE TRANSPONDER

(75) Inventors: Christophe Korn, Fenera di Varese (VA); Graziano Azzalin, Oleggio (IT); Pierre Guilmain, Valencia (IT); Francis Van Paemel, Carveglio (IT); Joan Vilaseca, Barcelona (ES); Javier Alvares Morte, Barcelona (ES)

(73) Assignee: European Community (EC), Brussels (DE)

( * ) Notice: Subject to any disclaimer, the term of this patent is extended or adjusted under 35 U.S.C. 154(b) by 332 days.

(21) Appl. No.: 10/070,414

(22) PCT Filed: Sep. 15, 2000

(86) PCT No.: PCT/EP00/09113

§ 371 (c)(1),
(2), (4) Date: Jul. 19, 2002

(87) PCT Pub. No.: WO01/20543

PCT Pub. Date: Mar. 22, 2001

(30) Foreign Application Priority Data

Sep. 15, 1999 (EP) ............................................ 99402256

(51) Int. Cl.$^{7}$ .......................... H01L 23/02; G08B 13/14
(52) U.S. Cl. ..................... 257/728; 257/730; 340/572.1
(58) Field of Search ................................ 257/710, 728, 257/730, 731; 340/572.1; 156/213

(56) References Cited

U.S. PATENT DOCUMENTS

| | | | | |
|---|---|---|---|---|
| 1,977,301 A | | 10/1934 | Bradford | |
| 1,997,301 A | | 4/1935 | Kniffen et al. | |
| 4,523,186 A | | 6/1985 | Fiarman | |
| 4,727,668 A | | 3/1988 | Anderson et al. | |
| 5,482,008 A | | 1/1996 | Stafford et al. | |
| 5,986,562 A | * | 11/1999 | Nikolich | 340/693.5 |
| 6,262,664 B1 | * | 7/2001 | Maloney | 340/572.8 |

FOREIGN PATENT DOCUMENTS

| | | |
|---|---|---|
| CH | 656 582 A5 | 7/1986 |
| EP | 0 825 554 A1 | 2/1998 |
| EP | 0 897 662 A1 | 2/1999 |
| WO | 97/38193 | 10/1997 |

* cited by examiner

*Primary Examiner*—W. David Coleman
(74) *Attorney, Agent, or Firm*—Bacon & Thomas, PLLC

(57) ABSTRACT

The invention provides a system for sealing, comprising:

a first capsule (20);

a second capsule (30);

electronic means (23, 33), for placing in at least one of the capsules, and capable of containing an electronic identity that is remotely interrogatable; and closure means (25-1, 25-2, 25-3, 25-4; 35-1, 35-2, 35-3, 35-4) to seal the two capsules together.

34 Claims, 9 Drawing Sheets

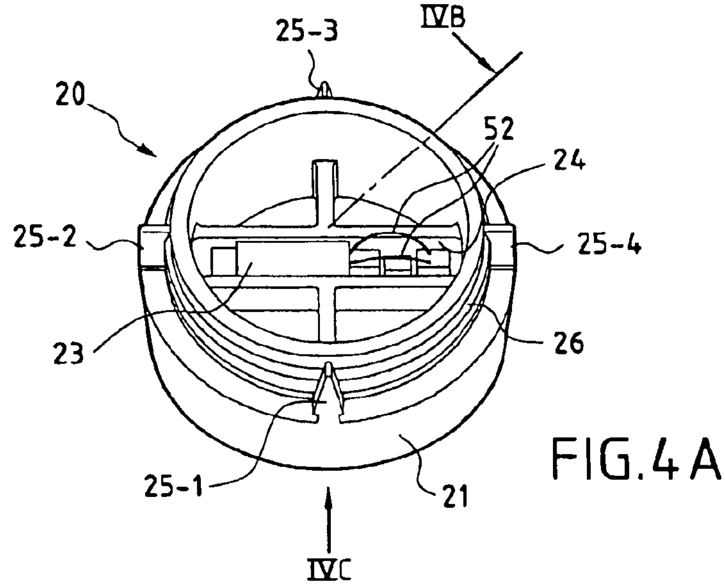
FIG.4A
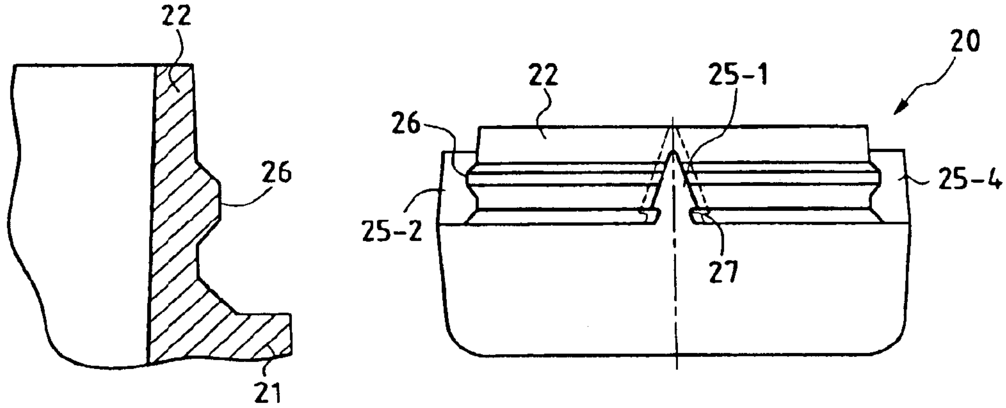
FIG.4B
FIG.4C
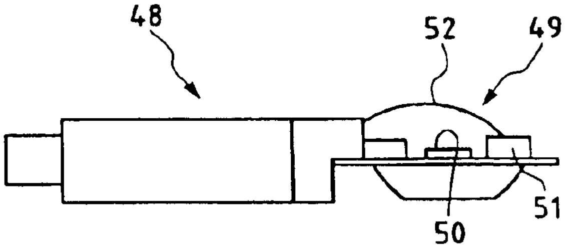
FIG.6

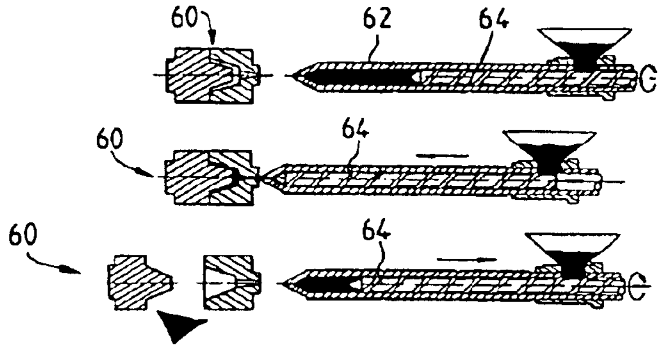
FIG.11A
FIG.11B
FIG.11C
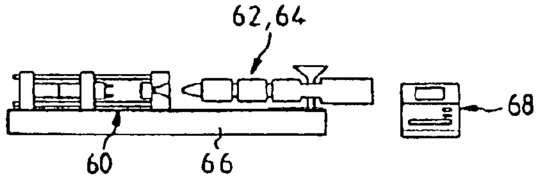
FIG.12
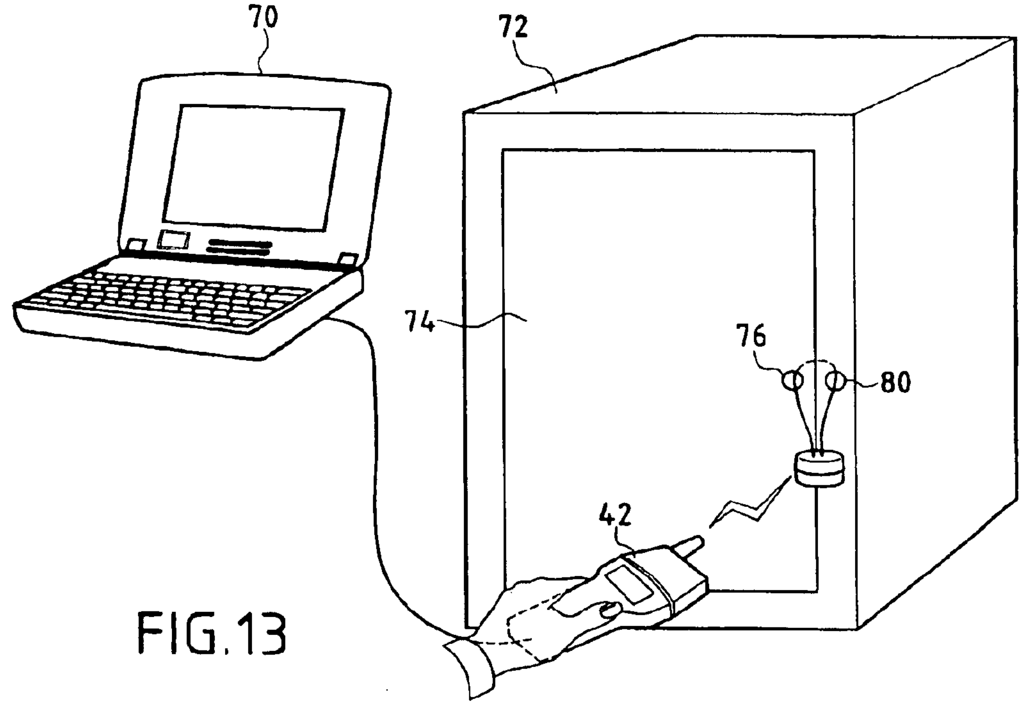
FIG.13

ELECTRONIC MULTIPURPOSE SEAL WITH PASSIVE TRANSPONDER

TECHNICAL FIELD AND PRIOR ART

The invention relates to a seal system, or a system for use as a seal, in order to mark articles that are to be identified over time.

Seals of this type are used for example to monitor shipping and/or storage of goods or equipment. A particular application relates to nuclear materials, which require high levels of safety for tracking and/or inspection.

There exists a type of seal, known as an "E type seal" or as a "copper-brass" type seal, which is used in large numbers (about 20,000 pieces per year) by the Energy XVII Directorate General (Euratom Safeguards) of Luxembourg, and also by the International Atomic Energy Agency (IAEA) of Vienna.

That commercial seal is simple and inexpensive. It is made up of two capsules, a copper capsule and a brass capsule. FIGS. 1A and 1B show the copper portion 2 in outside view (FIG. 1A) and in inside view (FIG. 1B). FIGS. 2A and 2B show the brass portion 4 in outside view (FIG. 2A) and it inside view (FIG. 2B). The identity of this seal is obtained using a drop of tin 6 which is placed inside the capsules, and then scratched in random manner so as to obtain a unique pattern 8. The capsules are snap-fastened together in order to close the seal while it is in use, and one of the capsules contains two orifices 10, 12 for passing the two ends of an optionally multi-stranded, wire or non metallic cord, for connecting together the elements that are to be sealed. For example, when sealing a door or a cupboard, the cord passes through the handles. The two ends of the cord are then knotted together inside the brass capsule 4, and the seal is closed.

The closed seal together with its cord 14, is shown in FIGS. 3A (copper side view) and 3B (brass side view).

The seal is used and its identity is inspected as follows.

Before installing the seal, the identities of the two capsules are photographed and then stored digitally in a database. That is an archiving step. An identity number etched on the capsule containing the identities is also archived as the number of the seal, in correlation with the two capsule identities.

During installation of the seal, its identity number is correlated with data such as: date of installation, place . . .

In order to inspect the seal, a subsequent inspection is performed. An inspector cuts the cord 14 and takes the seal to analysis premises (headquarters) where it is cut open. Its two identities are photographed and correlated by optical superposition with the reference identities in the archive.

Such a seal is of low cost, and it is simple to implement. Nevertheless, it is somewhat difficult to inspect, and inspection is also quite expensive. The cost of such a seal, including inspecting its identity, is of the order of 140 euros. In addition, it is not possible to inspect its identity on site and in real time, which means that a seal that has already been installed needs to be replaced regularly in order for it to be inspected in the analysis premises. When inspection is performed, there is therefore one seal which is being analyzed and another seal which has had to be installed to replace the seal being inspected.

In another aspect, it is not possible to read such a seal without removing it or damaging it.

In certain circumstances, inspection as explained above, although apparently simple, is quite difficult. This applies in particular if the seal is immersed.

The identification technique is not very easy: in particular it is necessary to photograph the identities and to correlate them with the number on the outside of the seal. All of those operations are lengthy and require handling which can lead to errors.

SUMMARY OF THE INVENTION

The invention seeks to solve these problems by proposing a seal for interconnecting elements that are to be sealed together, this seal comprising first and second capsules for sealing together and electronic means for placing in at least one of the capsules, the electronic means being capable of containing an identity of the seal and of being interrogated remotely.

Closure means enable the two capsules to be closed together.

Means are preferably provided for verifying whether or not this seal has been opened since being closed.

These means are preferably irreversible or single-use closure means. It is impossible to open them without destroying or damaging or marking them, at least in part. In other words, the seal cannot be opened without destroying or damaging or marking the closure means, at least in part.

The capsules are preferably provided with mechanical means for revealing breakage or deformation.

It is thus easy to verify whether or not the capsules have already been opened.

In the invention, the tin identities that used to be found inside the capsules are replaced by electronic identities or "codes", likewise placed inside the capsules. The identity of a seal can be read by active reader means.

The electronic means are preferably passive, thus requiring no power supply device or battery, thereby reducing the space occupied within the capsule in which they are installed.

The electronic means can be of the passive electronic transponder type, containing a digital code.

The effectiveness or security of the device is improved when using respective electronic means in each of the capsules. With two transponders, it is preferable for their axes to be disposed at 90° to each other.

In one embodiment, the seal system of the invention can be fixed by means of a cord, which is locked inside the seal without using a knot.

Using capsules that are made of plastics material enables effectiveness and reading distance to be improved.

It is preferable to use a material that presents plastic deformation characteristics. Any attempt at opening a seal made of such material will generally give rise to one or other portion of this seal becoming deformed, and in particular its closure means. Such deformation is easy to see in a plastically deformable material, since it leaves at least one mark therein.

One particularly suitable material it is based on at least 25% ABS.

In general, the device of the invention is inspected as follows:

- a reader device is moved up to a seal that contains an electronic identifier;
- an electromagnetic wave is sent to the seal; and
- the electronic identifier responds by re-emitting a wave containing information about its electronic identity.

The data can then be stored and/or transferred to a computer for long-term storage and/or analysis.

BRIEF DESCRIPTION OF THE FIGURES

The characteristics and advantages of the invention appear better in the light of the following description. This description relates to embodiments given by way of non-limiting explanation, and with reference to the accompanying drawings, in which:

FIGS. 4A to 5D show various portions of a seal of the invention;

FIG. 6 shows an electronic device (transponder) suitable for use with a seal of the invention;

FIGS. 11A to 11C show steps in a method of making a seal of the invention;

FIG. 12 is a diagram of a device for implementing the above method; and

FIG. 13 shows a device of the invention in use and being read.

DETAILED DESCRIPTION OF EMBODIMENTS

FIGS. 4A–4C and 5A–5D are various views of two capsules 20 and 30 of a seal of the invention.

The two capsules 20 and 30 are approximately cylindrical in shape, and they include means for closing the seal when in use. For example, they are designed to engage one in the other or to snap-fasten one to the other, and they are thus provided with a system or with means for snap-fastening or for mutual engagement, or with means for clipping together (closure by clip fastening).

In the closed position, the assembly is also sealed and it cannot be opened without destroying or deforming or marking the seal, at least in part.

Each capsule can have a location 24, 34 for receiving a respective electronic identity device 23, 33. A seal of the invention can also operate with only a single electronic identity device, in which case only one location is provided for receiving such a device, in only one of the two capsules.

Figure 5A:
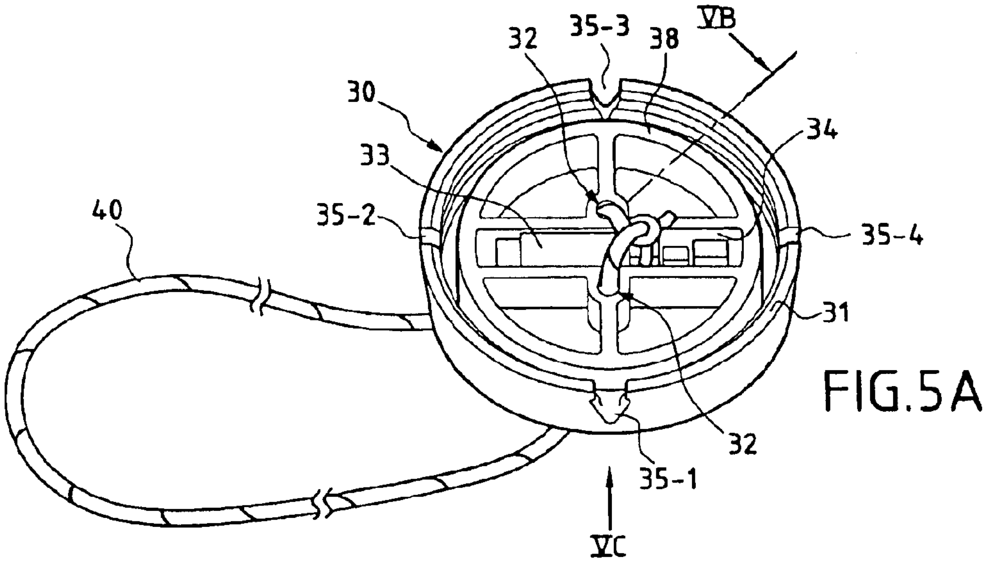

In one embodiment, the closure or snap-fastening means essentially comprise one or more tenons 25-1, 25-2, 25-3, 25-4 situated at the periphery of one of the capsules (FIG. 4A), and one or more corresponding mortises 35-1, 35-2, 35-3, 35-4 situated at the periphery of the other capsule (FIG. 5A). While the seal is being closed by mutual engagement or snap-fastening, each tenon **25-*i* (male portion of the snap-fastening system) penetrates into a corresponding mortise 35-*i*** (female portion).

By way example, one of the two capsules 20 comprises a base 21 of approximately cylindrical shape, with the tenons 25-1, 25-2, 25-3, 25-4 being disposed at one end thereof.

As shown in greater detail in FIGS. 4B and 4C, the same capsule can also comprise a ring 22 that is likewise substantially cylindrical in shape, having an outside diameter smaller than the outside diameter of the base 21. Around this ring 22, and thus set back from the outside surface of the base 21 and from the tenons 25-1, 25-2, 25-3, 25-4, there is formed a rib 26 of approximately trapezoidal section.

In this embodiment, the other capsule 30 has a wall 31 that is likewise approximately cylindrical in shape. On the inside periphery of this wall there is formed a groove 36 of approximately trapezoidal section corresponding to the rib 26 of the first capsule 20.

The rib 26 could be of some other shape. For example it could be approximately triangular in section. In which case the groove 36 is of corresponding shape, and specifically triangular in the example mentioned.

Figure 5B:
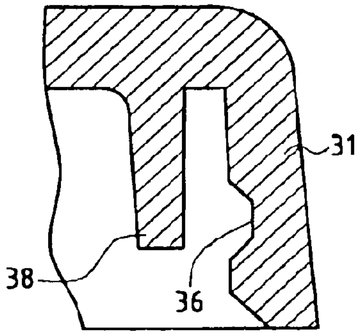
Figure 5C:
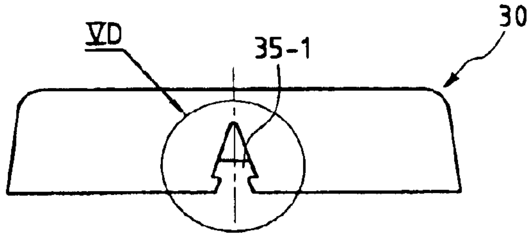
Figure 5D:
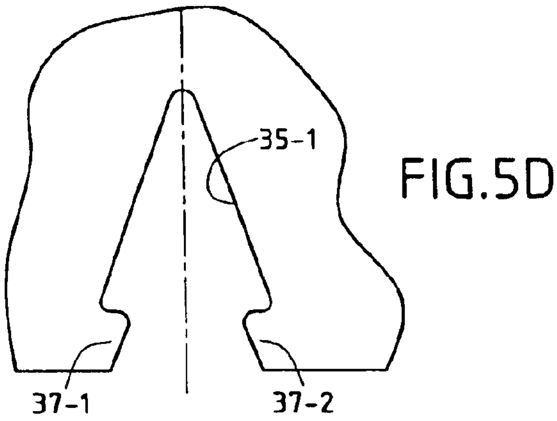

A substantially cylindrical collar 38 can also be formed inside the capsule 30. As shown in FIG. 5B, this collar extends in a direction parallel to be axis of symmetry of the capsule, at least as far as the groove 36.

When the two capsules are moved towards each other to be snap-fastened one in the other, the tenons are inserted into the mortises, and the ring 22 is inserted between the two cylindrical walls 31 and 38. By applying pressure, the tenons are fully inserted into the mortises, and the rib 26 is inserted into the groove 36.

The tenons can be extracted from the mortises only by forcing the snap-fastening system. The same applies to the rib 26, which cannot be extracted from the groove of 36 without being forced.

The snap-fastening means of the device of the invention, and in particular the combinations both of tenons and mortises, and also of the rib 26 and the groove 36 act as indicators of breakage or deformation in the event of an attempt at opening the seal. Such an attempt leaves marks, and/or scratches, and/or breakage of the snap-fastening means, and thus in the embodiment described, of the tenons, and/or of the mortises, and/or of the rib, and/or of the groove.

In this respect, a particularly advantageous embodiment is one in which each tenon is in the form of a triangular arrowhead or tip with a narrow base 27. The corresponding female portion, or mortise, (FIG. 5D) presents the corresponding triangular arrowhead or tip shape with projecting lips 37-1, 37-2 situated at the base. These lips co-operate with the narrow base 27 of the tenon so that the male portion (tenon) is inserted into the female portion (mortise) without any possibility of being extracted therefrom, other than by using force.

An electronic device suitable for use in the seal of the invention is shown in FIG. 6. It comprises a passive electronic transponder containing a digital code.

A transponder is a device that transmits the information it has in memory when it is activated by a transceiver. It may optionally store new information.

A transponder can be of the half-duplex type (HDX) or of the full-duplex type (FDX), where “half-duplex” means that it transmits its information after the transceiver has ceased to transmit the activating field and where “full-duplex” means that it transmits its information while the transceiver is transmitting the activating field.

Suitable transponders and their methods of interrogation are described in international standard document ISO 11785: 1996 (F) and in its appendices.

More precisely, such a device comprises antenna-forming means e.g. a portion 48 constituted by a ferrite core and a coil wound around the core, together with an electronic portion 49 incorporating memory means 50 and a capacitor 51. Connection wires 52 interconnect that two portions 48 and 49. Any attempt at opening the seal will break these wires or the ferrite, or the antenna coil, thereby constituting additional monitoring means for the seal. On subsequent interrogation of the transponder, it will be seen immediately that the device is not operating properly.

By way of example, such a transponder is described in document EP 480 530.

An example of a suitable transponder is an injectable Tiris model made by Texas Instruments having a length of 23 millimeters (mm) and a diameter of 3.8 mm. It is encapsulated without its glass tube in one or both of the capsules 20, 30, thereby making it possible to obtain a degree of mechanical integrity for the identifier. This half-duplex transponder contains a unique code programmed in the factory on 64 bits. Because of the code structure used, 274,877,906,944 digital code combinations are possible.

It is also possible to use other transponders, which can be of the full duplex, programmable, or multi-page type. For reasons of cost, ease of use, mass production, and reading distance, the above-specified Tiris transponder was selected for the initial prototypes.

Figure 1A:
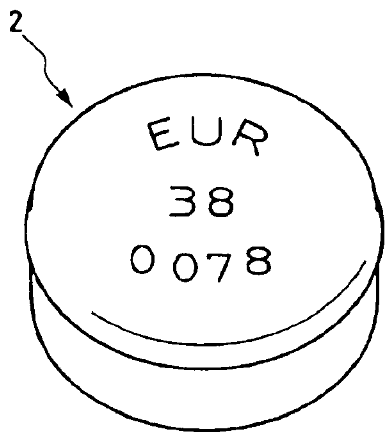
FIG.1A PRIOR ART
FIGS. 1A to 2B represent various portions of a seal that is known in the prior art.
Figure 1B:
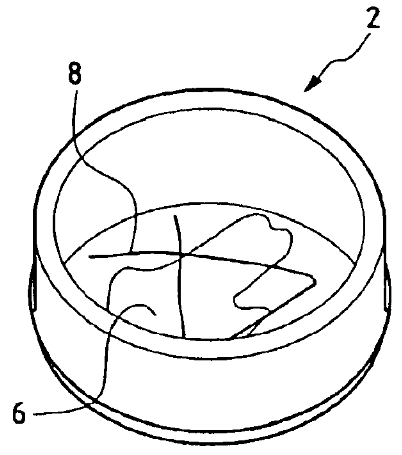
FIG.1B PRIOR ART
Figure 2A:
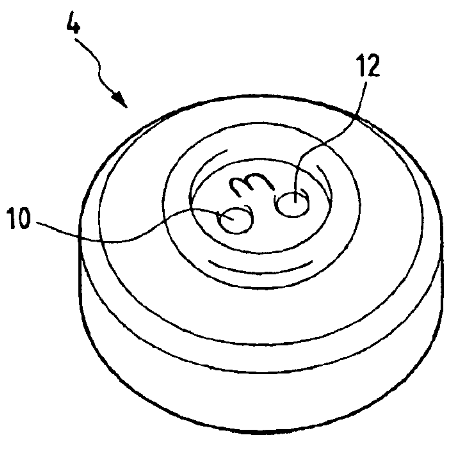
FIG.2A PRIOR ART
Figure 2B:
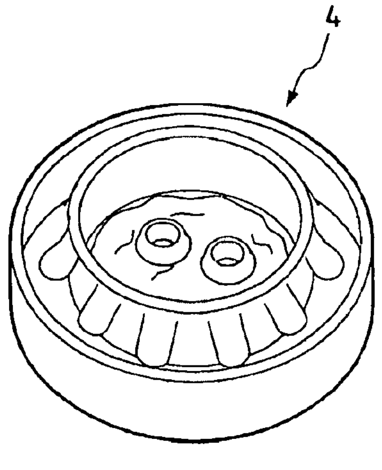
FIG.2B PRIOR ART
Figure 3A:
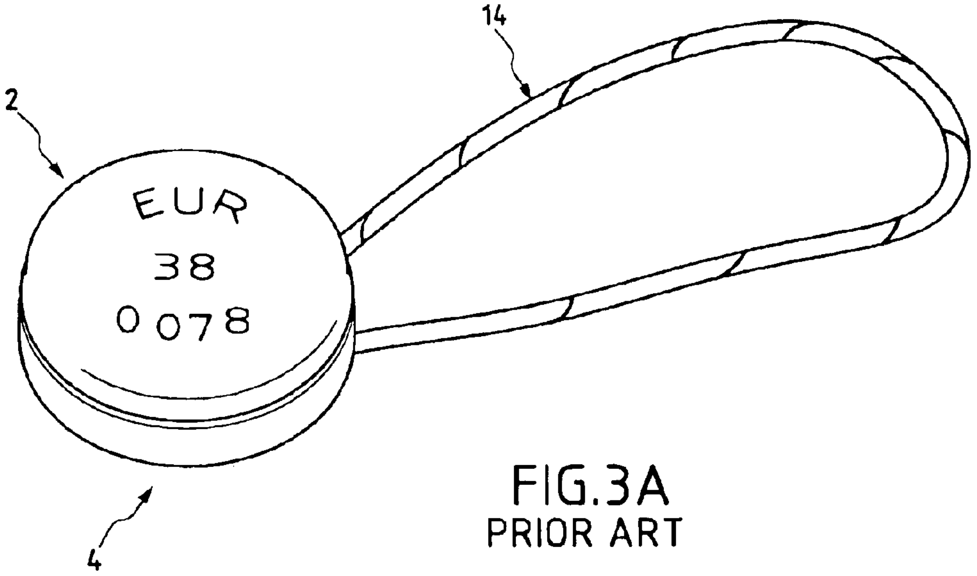
FIG.3A PRIOR ART
FIGS. 3A and 3B represent a prior art seal in its closed position together with a cord.
Figure 3B:
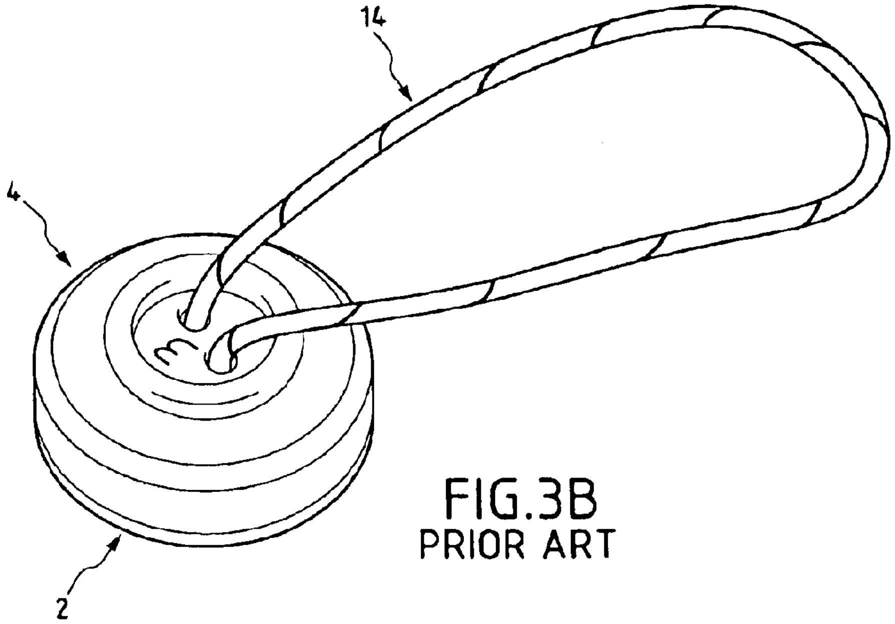
FIG.3B PRIOR ART

The seal of the invention can be installed in the same manner as the prior art seal described above with reference to FIGS. 3A and 3B.

Means are provided in particular for attaching the seal to an external device, from inside the seal, or indeed for interconnecting two elements that are to be sealed together.

Two orifices 32 can be provided for this purpose in one or other of the two capsules 20, 30.

Figure 7A:
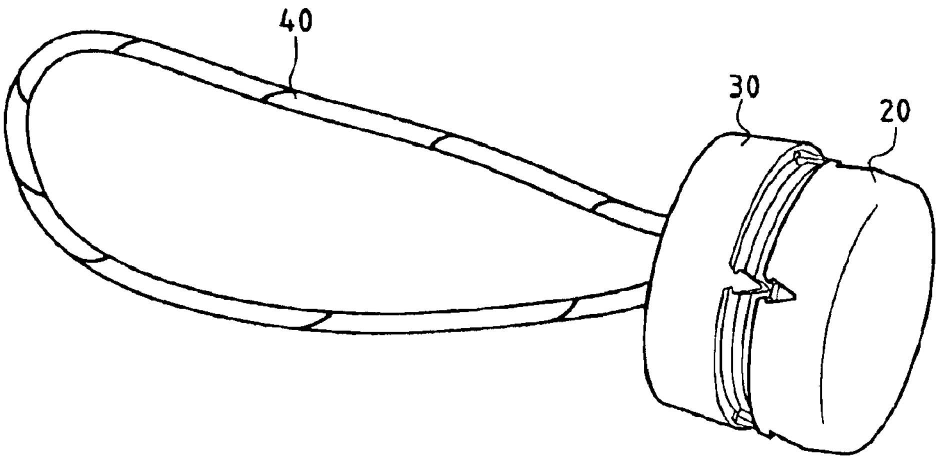
FIGS. 7A and 7B show as seal of the invention mounted with a cord, respectively ready for closing, and then closed.
Figure 7B:
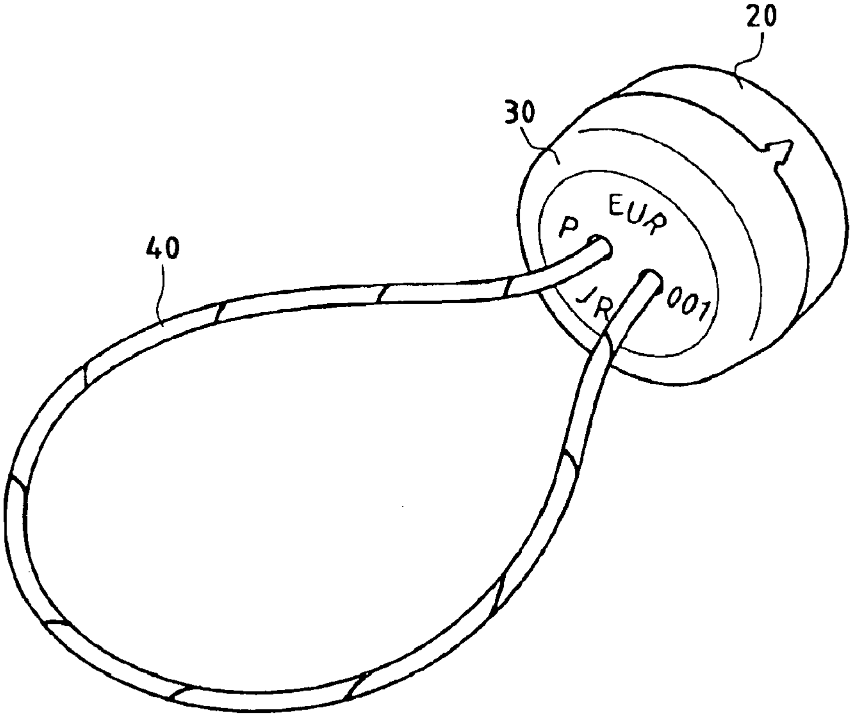

A wire cord 40 can be knotted inside the capsules by passing through the two orifices (FIG. 5A, 7A). The seal can then be closed manually, merely by applying pressure (FIG. 7B), with the knot in the cord then being contained and enclosed within the seal.

In other words, the means enabling this seal to be fixed to an external devices are such that the seal cannot be detached without being opened, thereby destroying, at least in part, the fixing means or the integrity thereof (in this case: without cutting the cord).

Figure 8:
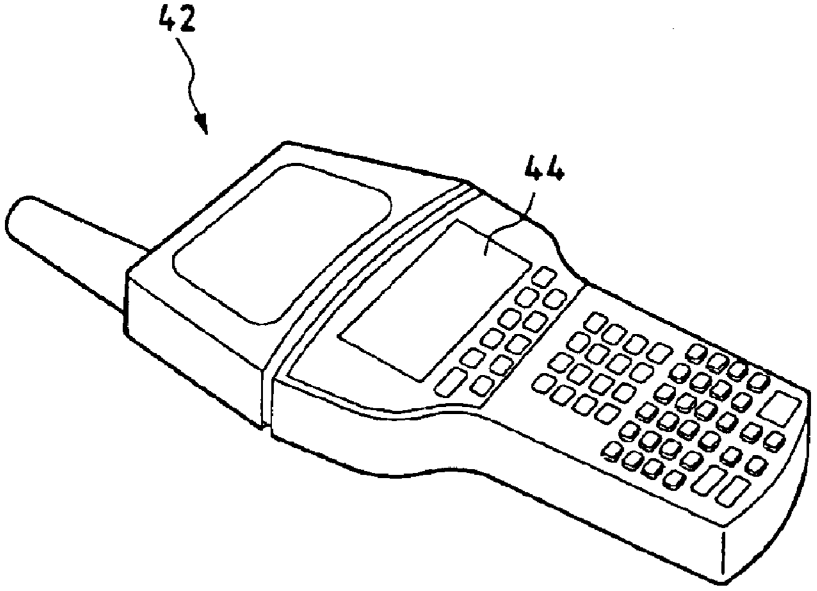
FIG. 8 shows a device for reading the identity of the seal of the invention.

The identity of the seal (transponder code numbers) can be read for example by using a portable reader 42 (FIG. 8). By way of example, such a reader can also include a display screen 44 and/or means for storing the interrogated data.

The reader activates the transponder at radio frequency (RF), for example at a frequency of 134.2 kilohertz (kHz). This RF wave charges the capacitor of the transponder. While the capacitor is discharging, it returns a code or information written in the memory of the transponder to the reader.

The code of each interrogated transponder is thus returned to the reader 42 and displayed on its liquid crystal screen 44, and/or stored in its memory, or transferred in real time via a serial interface to a portable computer. Software establishes correlation between the identity number of the seal (the transponder code) and various data items, for example the place, and/or the date, and/or the name of the inspector who installed the seal.

In an embodiment, two portable readers are used. The first is a Diehl DHP 102 reader (delivering an electric field of 104 dB $\mu$V/m at 3 meters), connected to a small Psion Walkabout "palmtop" computer.

The second is a Gesimpex Gesreader IIS reader containing memory and software, and provided with a keypad for manually inputting data, operating at the same frequency and with the same electric field as the Diehl. This reader is also fitted with an internal antenna and can receive an external stick antenna for special uses.

The transponders are activated (at a frequency of 134.2 kHz) by means of a radio module that can be connected to the end of the palmtop.

It is also possible to use other readers complying with ISO standards 11784 and 11785 (already cited above). Those standards define the read mode, the modulation used, the recommended frequencies, the activation periods, and in general manner all of the operating parameters for such devices.

The system developed in this way can read the identity of a seal at a distance lying the range direct contact to 30 centimeters (cm) (as a function of the reader used), which suffices for most uses.

The security of the system as a whole is reinforced by using two transponders (one each of the capsules 20, 30). Each transponder possesses its own code, with the two codes ($C_1$, $C_2$) corresponding to each other and corresponding to a single seal, e.g. identified by a number. A database holds information relating to the seal numbers, together with the corresponding pairs of codes ($C_1$, $C_2$). If a person opens the seal and replaces one of the transponders (for example the transponder having the code $C_1$), by some other transponder having the code $C'_1$, then the new state ($C'_1$, $C_2$) of the pair of codes will no longer correspond to a pair of codes that appears in the database. This enables the seal to provide finer surveillance.

A seal containing two transponders operates at its best when the two transponders, or their axes of maximum sensitivity, are disposed perpendicularly to each other.

In order to ensure that the two transponders are properly positioned relative to each other, it is possible to use seals whose closure means are arranged asymmetrically on the capsules, or in other words which define a single position in which the two capsules can be closed together.

Thus, FIG. 4C shows an embodiment in which one of the tenons 25-1 (shown in dashed lines) is larger than the others. The corresponding female portion in the capsule 30 is likewise of a size larger than that of the other female portions. This defines a single possible closure position.

Figure 9:
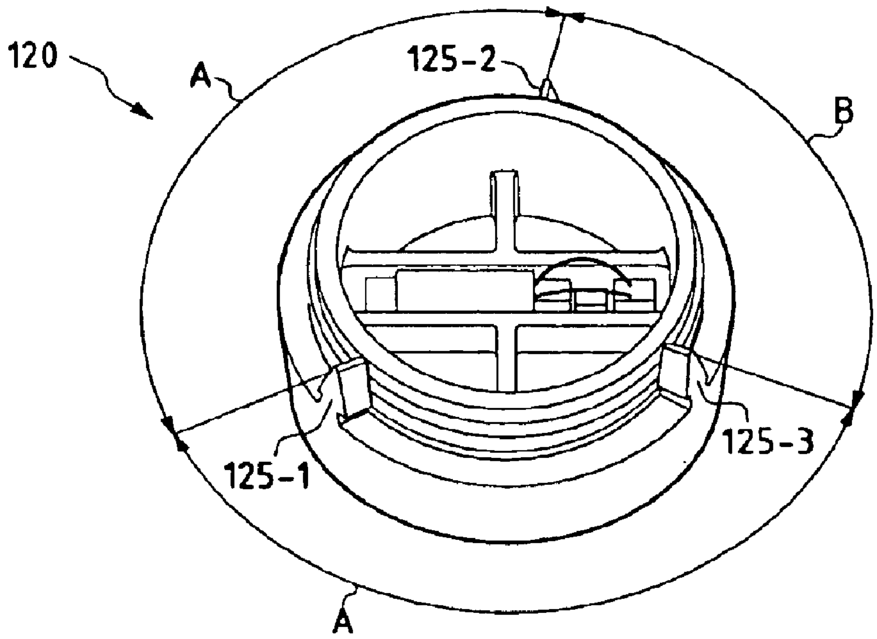
FIG. 9 shows a variant of a seal of the invention.

Another embodiment of a capsule 120 is shown in FIG. 9. Three tenons 125-1, 125-2, 125-3 are disposed at unequal distances from one another (the angles A and B are respectively 125° and 110°), the three corresponding mortises being disposed in the same manner on the other capsule. This likewise defines a single closure position.

In yet another embodiment, the four tenons are disposed at different angles from one another. For example, the first and second tenons can be separated by an angle A', as can the second and third tenons, while the third and fourth tenons are separated by an angle B' ($^{1}$ A'), and the fourth and first tenons are separated by an angle C' (C'$^{1}$B' and C'$^{1}$ A'). The following values can be used: A'=90°, B'=85°, and C'=95°. In general, depending on the embodiment, the angles are selected in such a manner that at least two or three of the four angles are different from one other.

In the above-described embodiments, the wire cord is knotted inside the capsules. This requires the person responsible for closing the seal to tie a knot in the cord 40, which takes time, even though the environment might be dangerous. For example, such seals are placed on boxes containing nuclear materials, and/or the operator might be physically in a position that is unstable, e.g. on a ladder.

In order to solve this problem, another embodiment enables the cord 40 to be locked inside the seal without it being necessary to tie a knot in the cord.

This embodiment is described below with reference to FIGS. 10A to 10C.

In these figures, references identical to references used in FIGS. 4A to 5D represent elements that are identical or similar to those described above with reference to those figures.

Figure 10A:
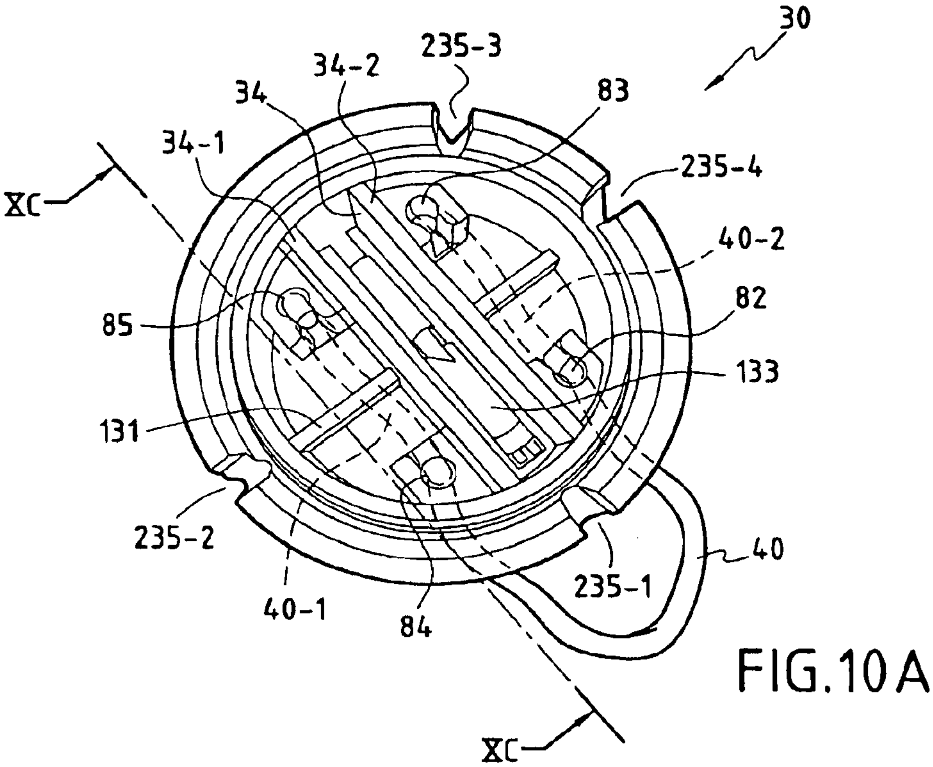
FIGS. 10A to 10C show another embodiment of a seal of the invention.
Figure 10B:
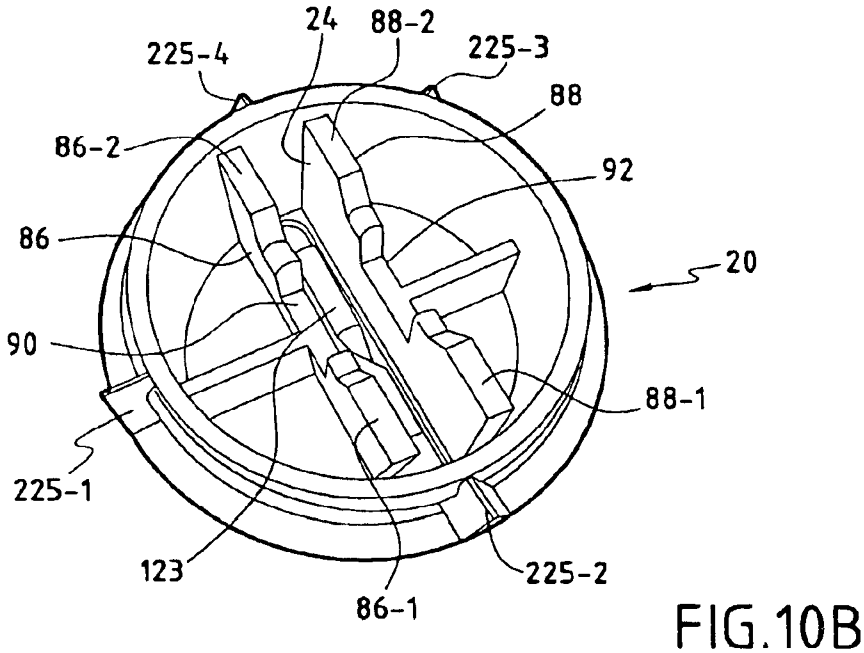

In particular, the seal in FIGS. 10A and 10B comprises two capsules 20, 30, e.g. capsules that are approximately circular in shape, and it also comprises means for closing the seal while it is in use. These two capsules engage one in the other as already described above, using a system of tenons 225-1, . . . , 225-4 and mortises 235-1, . . . , 235-4. These means preferably define a single closure position.

Inside the capsule 30, a groove 34 serves to receive an electronic identity device 133 of the type already described above. By way of example, this groove can be defined by two walls or ribs 34-1, 34-2 e.g. disposed on either side of the diameter of the capsule 30, as shown in FIG. 10A.

Holes 82, 83, 84, and 85 serve to receive a cord such as a wire cord 40. By way of example, one of the ends of the cord is inserted into the hole 82, and then leaves the capsule 30 via the hole 83, while the other end is inserted into the capsule via the hole 84 and leaves via the hole 85.

The other capsule 20 also has two ribs 86, 88. When the seal is in the closed position, these ribs are designed to be disposed substantially perpendicularly to the ribs defining the groove 34. For this purpose, they have middle openings 90, 92 through which the ribs 34-1, 34-2 pass when the seal is in the closed position. Lateral ribs 86-1, 86-2, 88-1, 88-2 come to bear against the strands of cord 40 which are located inside the seal, when the seal is in the closed position.

Figure 10C:
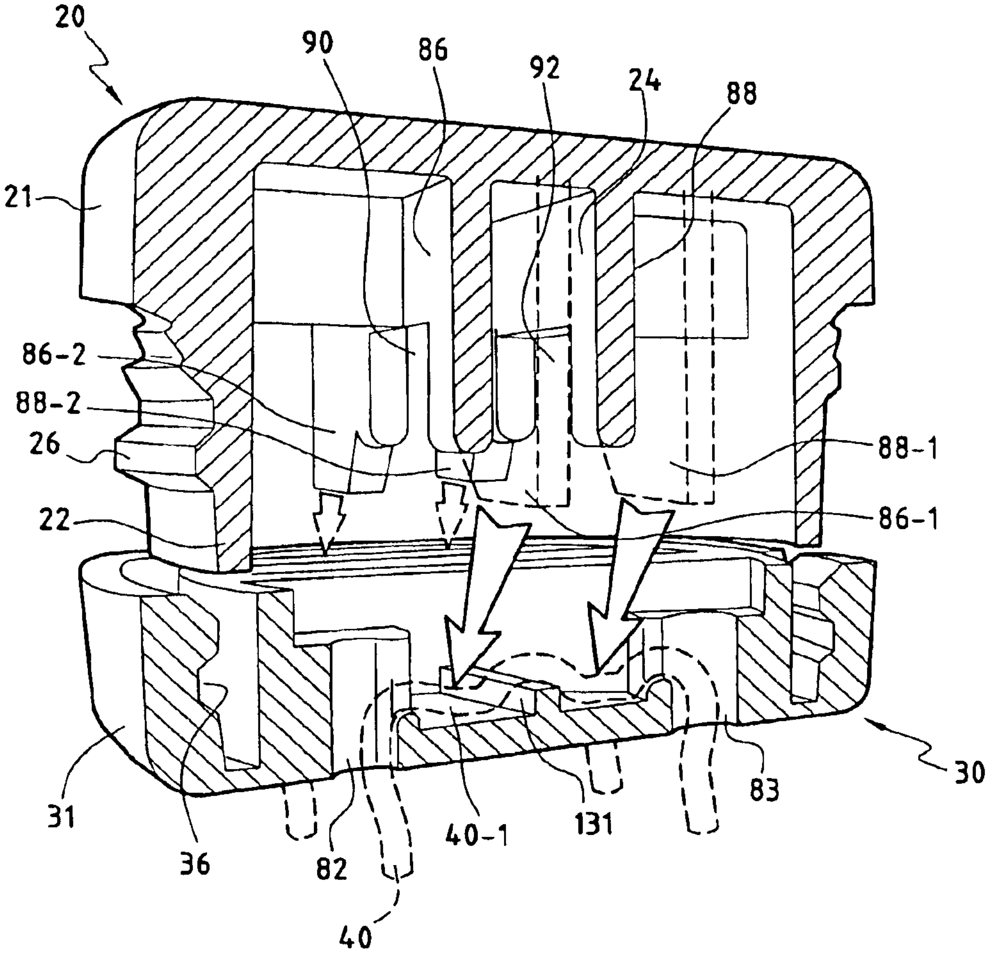

Thus, in FIG. 10C the shoulders 86-1 and 88-1 are shown as bearing against the cord 40 inside the seal. The other two shoulders 86-2 and 88-2 come to bear against the other portion 40-2 (not visible in FIG. 10C) of the cord 40 that is likewise situated inside the seal.

The ribs 86 and 88 can define and groove 24 containing an electronic identity device 123 of the same type as that described above. This device is not shown in FIG. 10C.

In this embodiment, at least one hole or orifice is provided for receiving a strand or an end of the cord 40 inside the seal while in the open position. Means are provided inside the seal for locking this strand or cord within the seal when the seal is closed.

A second orifice enables the other strand or end of the cord to be inserted into the seal in the same manner as the first strand or end. Second locking means enable this second strand or end to be locked inside the seal after it has been inserted into the seal.

In the embodiment described, the locking means comprise at least one locking rib on either side that locks the cord against an inside surface of the other capsule. In FIG. 10C, the cord is locked against the bottom of the capsule 30.

In a variant, the seal contains only one electronic identity device 123 received in the capsule 20 between the ribs 86 and 88, the other capsule 30 containing only the strands or ends of the cord 40. The cord is then locked in the same manner as that described above.

An additional rib 131 can be provided transversely at the bottom of the capsule 31 to provide even more effective locking of the cord 40 inside the seal by co-operating with thrust from the shoulders 86-1, 88-1 or from the ribs 86, 88.

Once the two strands or ends of the cord have been locked inside the seal, the outside portion of the cord constitutes a loop which passes through two portions of a lock or through two holes pierced in a door and in a fixed portion of a door frame, for example, and as shown below in FIG. 13.

The cord 40 is thus initially passed via the elements that are to be kept closed (e.g. through the holes 76 and 80 in FIG. 13), then one of its strands is inserted into the holes 82 and 83 of the seal, as shown in FIG. 10A, and the other strand is subsequently inserted into the holes 84 and 85. This seal is then closed, locking the cord inside without any knot needing to be tied.

Although the seal of the invention can be made of copper or of brass, it is preferably made of a plastics material so that any attempt at opening the seal leaves marks on the plastics material. A particularly suitable material is ABS (acrylonitrile butadiene styrene).

ABS material also gives the seal of the invention excellent effectiveness in reading, close to 100%, which is better than the effectiveness obtained with seals made of brass, copper, or aluminum.

In addition, ABS presents plastic deformation characteristics. If it is deformed (as happens when an attempt is made to tamper with a seal of the invention) then traces of deformation remain. A seal made out of such a material therefore possesses a high degree of security.

In particular, it is possible to use a thermoplastic material obtained by mixing polycarbonate (PC, Makrolon) and acrylonitrile butadiene styrene (ABS, Novodur), such as Bayblend ref T85MN from BAYER.

Bayblend ref T85MN presents a softening point value of 8 (about 130 VST/B ° C.) on the Vicat B scale. An index of 5 means that the substance has not been modified.

Depending on its exact composition, a PC-ABS mixture remains dimensionally stable on heating to a temperature lying in the range 110° C. to 134° C. The limits of this range are thus the corresponding temperatures for ABS and for PC.

The rigidity and the hardness of a PC-ABS mixture (with at least 25% ABS; e.g.: 30% ABS and 70% PC) are conferred by the PC. Bayblend is remarkable essentially for high impact strength and its ability to elongate without breaking.

A PC-ABS mixture and in particular Bayblend also provides excellent electrical insulation properties. Its bulk resistivity is $10^{12}$ ohm centimeters (W cm), its surface and resistivity is $\mathbf{10}^{14}$ W cm, and its breakdown resistance is 24 kilovolts per millimeter; these mixtures are influenced very little by variations in temperature or humility.

The most important characteristics of such a mixture are stability against thermal deformation, toughness, and rigidity.

A seal of thermoplastic material can be made by molding. The method consists in injecting a molten mass of material into a closed mold, which is subsequently cooled down. The plastics material solidifies and can then be extracted from the mold.

FIGS. 11A to 11C are diagrams showing the steps in such a method.

Initially (FIG. 11A) a mold 60 is closed. A plastics material is introduced into an injection cylinder 62 while in the molten state. It is injected into the mold 60 by means of a screw 64.

Thereafter (FIG. 11B) the screw is maintained in the advanced position for a certain length of time, so as to maintain the pressure of the material while it solidifies.

Once the material has solidified in the mold, the mold is opened and the molded material is released (FIG. 11C).

FIG. 12 is a diagram of a device for implementing the method. The mold 60 and the injector device 62, 64 are mounted on a bench 66. The assembly is controlled by a control unit 68.

Inside the seal, the electronic means can be fixed using a semi-rigid resin, without any solvent. For example this can be a resin based on polyalcohol, castor oil, and calcium carbonate (catalyst: diphenylmethane diisocyanate). One such resin is known under the name "Diapol 508". It is 100 percent polymerized and presents low water absorption. It hardens at ambient temperature and it is not chemically aggressive. Its dimensional stability is good and it provides good adhesion on metals and on plastics.

The device of the invention with its electronic means capable of being read or interrogated from outside the seal present the following advantages.

Firstly, the identity of the electronic means and thus of the seal can be read while the seal remains closed, without the seal being disassembled or spoilt. It is also possible to inspect said identity while the seal is installed on site, likewise without disassembling or damaging the seal. Reading can thus be performed quickly, and it does not require an operator to remain for any length of time close to devices having the seals applied thereto. When dangerous materials such as nuclear materials are concerned, this time required for reading is particularly critical.

The seal can also be read while it is immersed.

When using programmable or encryptable electronic means, and in particular programmable or encryptable transponders, it is possible to encrypt the identities of the seals, thus providing a high level of security.

Using a reader to identify the identity of a seal makes inspection easier. It suffices to take the reader to each of the sites that is to be inspected: there is no need to take each of the seals to a laboratory or an analysis site which requires seal-opening means to be used together with photographic identification means.

It is easy to store the identity read during an inspection, merely using a simple serial computer link. It is possible to establish simple correlations between identities and inspection data. This results in a significant saving in the time required for reading identities, and also reduces the cost of identification.

It is also possible to use multi-page transponders so as to store a wide variety of information, thereby further increasing the options made available by the seal.

Finally, a system made it in this way is of relatively low cost, since it can be produced at a unit price of about 14 to 20 euros depending on the quantities produced.

An application of the invention is shown in FIG. 13.

A box 72 contains material that is to be kept under seal, for example nuclear materials (plutonium, uranium, . . . , etc). Both the box 7 and the fixed portion of the box are pierced by respective holes 76 and 80.

The box is sealed by a device of the invention using a cord 40 that passes through the holes at 76 and 80. At least one of the capsules in the device of the invention contains electronic identity means that can be remotely interrogated.

During an inspection, a reader 42 is brought up to the seal and interrogates the electronic identity means in the manner described above.

Coding information returned by the seal to the reader 42 can subsequently be transmitted to a portable computer 70 in which the data is stored, and which can be used to perform subsequent analyses. The data can also be stored and processed in the reader 42 itself, without the reader being connected to a portable computer. Data can thus be read simply and very quickly.

The example shown comprises a box containing nuclear material. Other applications relate to boxes containing electrical equipment (e.g.: an electricity meter) or containing gas meters, or containing food when it is desired to be certain that it has not been tampered with (e.g. oil).

What is claimed is:

1. A system for sealing, comprising:

a first capsule (20);

a second capsule (30);

electronic means (23, 33), for placing in at least one of the capsules, and capable of containing an electronic identity that is remotely interrogatable; and closure means (25-1, 25-2, 25-3, 25-4; 35-1, 35-2, 35-3, 35-4), to seal the two capsules together, comprising at least a male portion situated at the periphery of one of the capsules, and at least a female portion situated at the periphery of the other capsule, the two portions snap-fastening together.

2. A system according to claim 1, the capsules being provided with indicators to indicate breakage or deformation.

3. A system according to claim 1, said male portion (25-1, 25-2, 25-3, 25-4) and female portion (35-1, 35-2, 35-3, 35-4), co-operating in such a manner as to form an assembly that can be opened only by force.

4. A system according to claim 1, the closure means including at least one tenon and mortise assembly.

5. A system according to claim 1, the two capsules are being substantially cylindrical in shape, one of the capsules (20) having a rib (26) which co-operates with a groove (36) formed in an inside surface of the other capsule (30).

6. A system according to claim 1, the closure means of the two capsules defining a single closure position.

7. A system according to claim 6, the closure means being separated around the two capsules and defining angles between one another, at least two of the angles being different.

8. A system according to claim 1, the electronic means (23, 33) being passive electronic means.

9. A system according to claim 1, the electronic means (23, 33) being programmable electronic means.

10. A system according to claim 1, the electronic means (23, 33) comprising at least one electronic transponder capable of being encoded digitally.

11. A system according to claim 10, including two passive electronic transponders capable of being encoded digitally.

12. A system according to claim 1, the electronic means (23, 33) including one or more wires (52) suitable for being broken by the system being opened after the system has once been closed.

13. A system according to claim 1, further comprising means (32) enabling the system to be fixed to an external device.

14. A system according to claim 13, further comprising means (40) for fixing it to an external device.

15. A system according to claim 1, including at least one opening (82–84) for passing a cord (40) and cord-locking means for locking the cord inside the system once it has been inserted therein and the system has been sealed.

16. A system according to claim 15, the cord-locking means comprising at least one rib (86, 88) formed in one of the capsules.

17. A system according to claim 1, one of the capsules including first and second orifices (82–85) for inserting a cord, the other capsule including first and second ribs (86, 88) which press against the cord when the two capsules are sealed together.

18. A system according to claim 17, the first and second ribs defining a groove (24) for receiving electronic means suitable for containing an electronic identity and suitable for being interrogated remotely.

19. A system according to claim 1, including first and second cord-insertion orifices (82–85) and first and second internal ribs which press against the cord when the capsules are sealed together.

20. A system according to claim 1, the capsules (20, 30) being made of plastics material.

21. A system according to claim 1, the capsules (20, 30) being made of a material that presents plastic deformation characteristics.

22. A system according to claim 21, the material comprising at least 25% ABS.

23. A seal system comprising a first capsule (20) and a second capsule (30), and electronic means (23, 33) disposed in at least one of the capsules, the electronic means containing at electronic identity and being suitable for being interrogated from outside the seal system, the two capsules being sealed together by means of at least a male portion situated at the periphery of one of the capsules, and at least a female portion situated at the periphery of the other capsule, the two portions snap-fastening together.

24. A seal system according to claim 23, the electronic means (23, 33) comprising at least one passive electronic transponder.

25. A system according to claim 24, including a passive electronic transponder in each of the capsules.

26. A system according to claim 25, the two transponders being disposed perpendicularly relative to each other.

27. A seal system according to claim 23, the system including first and second orifices (32, 82, 83) for passing a cord (40).

28. A seal system according to claim 23, further comprising a cord (40) for fixing the seal system.

29. A seal system according to claim 28, the cord being locked in a system of without using a knot.

30. A system according to claim 28, the cord being locked in the seal system between a wall of one of the capsules and a rib (86, 88) or a shoulder (86-1, 86-2, 88-1, 80-2) of a rib (86, 88) formed in the other capsule.

31. A method of inspecting a seal system according to claim 23 in which a reader device (42) is brought up to the seal, a wave is sent to the system, and a wave transmitted by the system is received, which wave contains information concerning the electronic identity.

32. A method according to claim 31, the reader device including a storage means, and means for manually inputting data.

33. A method according to claim 31, the data concerning the electronic identity information being transferred to a computer (70).

34. A method according to claim 31, the seal system being attached to a container (72) containing nuclear material, or electrical material, or foodstuff.

* * * * *